(12) United States Patent
Siddik et al.

(10) Patent No.: US 11,569,390 B2
(45) Date of Patent: Jan. 31, 2023

(54) MEMORY CELLS AND INTEGRATED ASSEMBLIES HAVING CHARGE-TRAPPING-MATERIAL WITH TRAP-ENHANCING-ADDITIVE

(71) Applicant: Micron Technology, Inc., Boise, ID (US)

(72) Inventors: Manzar Siddik, Boise, ID (US); Terry H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 16/724,753

(22) Filed: Dec. 23, 2019

(65) Prior Publication Data

US 2021/0193845 A1 Jun. 24, 2021

(51) Int. Cl.
| | |
|---|---|
| H01L 21/00 | (2006.01) |
| H01L 29/792 | (2006.01) |
| H01L 27/11568 | (2017.01) |
| G11C 16/04 | (2006.01) |
| H01L 29/423 | (2006.01) |
| H01L 27/11578 | (2017.01) |

(52) U.S. Cl.
CPC ........ *H01L 29/792* (2013.01); *G11C 16/0466* (2013.01); *H01L 27/11568* (2013.01); *H01L 27/11578* (2013.01); *H01L 29/4234* (2013.01)

(58) Field of Classification Search
CPC ............. H01L 29/792; H01L 27/11568; H01L 27/11578; H01L 29/4234; G11C 16/0466
See application file for complete search history.

(56) References Cited

U.S. PATENT DOCUMENTS

| | | | | |
|---|---|---|---|---|
| 6,853,035 B1 * | 2/2005 | King | ................... | G11C 11/4125 257/298 |
| 8,846,516 B2 * | 9/2014 | Ramaswamy | .... | H01L 29/42332 438/591 |
| 9,406,574 B1 * | 8/2016 | Byun | ................... | H01L 21/0223 |
| 2003/0091257 A1 * | 5/2003 | Chakrabarti | ......... | G02B 6/1342 385/2 |
| 2008/0242034 A1 * | 10/2008 | Mokhlesi | .......... | H01L 27/11582 438/287 |
| 2010/0309729 A1 * | 12/2010 | Chang | ............... | H01L 27/11568 365/185.28 |

(Continued)

*Primary Examiner* — Richard A Booth
(74) *Attorney, Agent, or Firm* — Wells St. John P.S.

(57) ABSTRACT

Some embodiments include a memory cell having charge-trapping-material between a semiconductor channel material and a gating region. The charge-trapping-material includes silicon, nitrogen and trap-enhancing-additive. The trap-enhancing-additive includes one or more of carbon, phosphorus, boron and metal. Some embodiments include an integrated assembly having a stack of alternating first and second levels. The first levels include conductive structures and the second levels are insulative. Channel-material-pillars extend through the stack. Charge-trapping-regions are along the channel-material-pillars and are between the channel-material-pillars and the conductive structures. The charge-trapping-regions include a charge-trapping-material which contains silicon, nitrogen and trap-enhancing-additive. The trap-enhancing-additive includes one or more of carbon, phosphorus, boron and metal.

53 Claims, 11 Drawing Sheets

(56) References Cited

U.S. PATENT DOCUMENTS

| | | | |
|---|---|---|---|
| 2011/0294290 A1* | 12/2011 | Nakanishi | H01L 27/11524 438/666 |
| 2012/0104484 A1* | 5/2012 | Lee | H01L 45/1233 257/324 |
| 2017/0301685 A1* | 10/2017 | Dorhout | H01L 23/53257 |

* cited by examiner

MEMORY CELLS AND INTEGRATED ASSEMBLIES HAVING CHARGE-TRAPPING-MATERIAL WITH TRAP-ENHANCING-ADDITIVE

TECHNICAL FIELD

Memory cells and integrated assemblies. Charge-trapping-material. Incorporation of trap-enhancing-additive (e.g., carbon, boron, phosphorus, metal, etc.) within charge-trapping-material.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping-material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

A problem with some memory cells is that charge-trapping-material within the memory cells may have too many shallow traps, and accordingly may have poor charge retention. It is desired to improve charge retention of charge-trapping-material.

DETAILED DESCRIPTION OF THE ILLUSTRATED EMBODIMENTS

Some embodiments include incorporation of trap-enhancing-additive (e.g., one or more of carbon, boron, phosphorus, metal, etc.) in charge-trapping-material to improve charge-retention properties of the charge-trapping-material. The charge-trapping-material may be utilized in memory cells and integrated assemblies. Example embodiments are described with reference to FIGS. 5-10.

Figure 1:
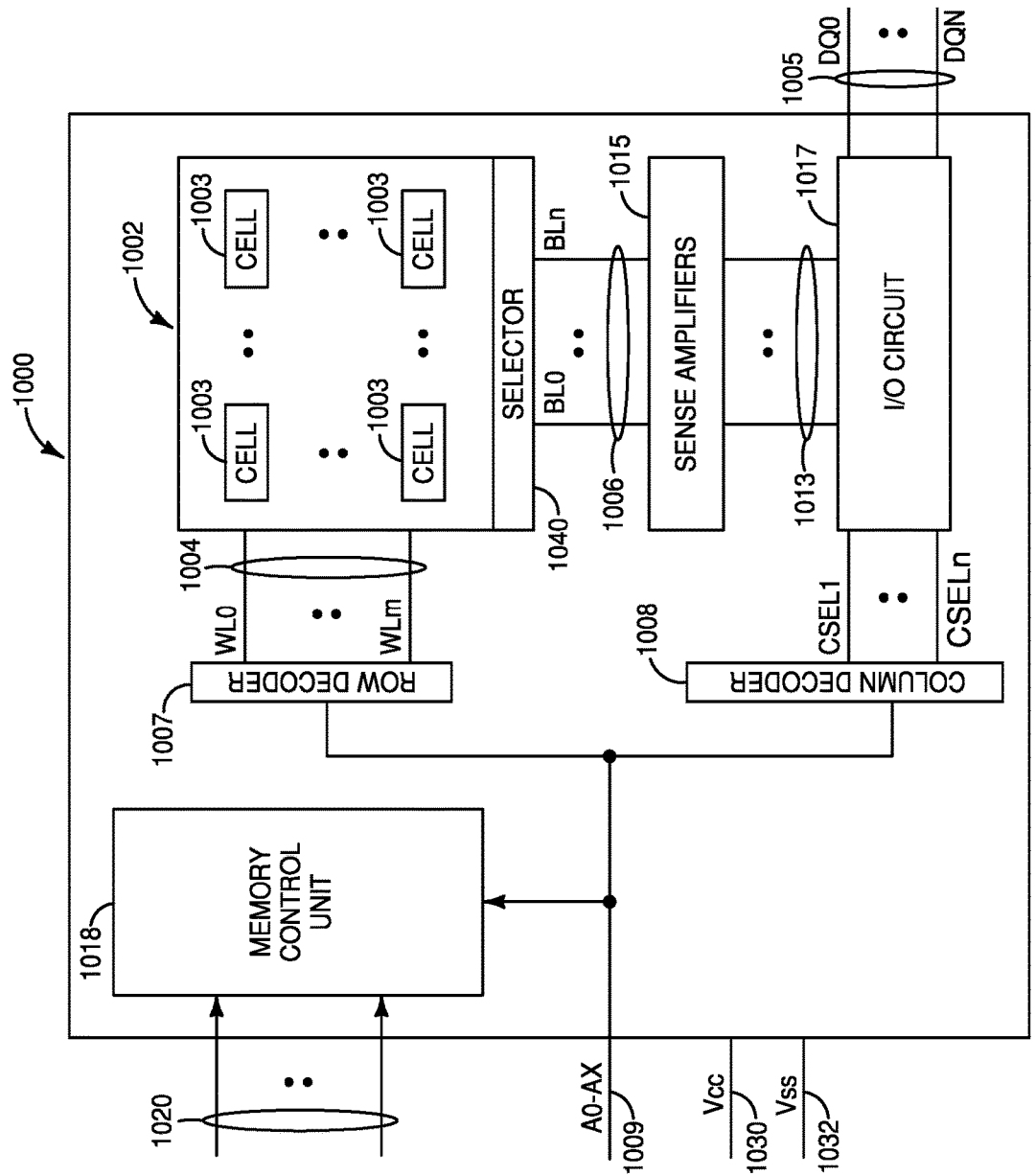
FIG. 1 shows a block diagram of a prior art memory device having a memory array with memory cells.
Figure 2:
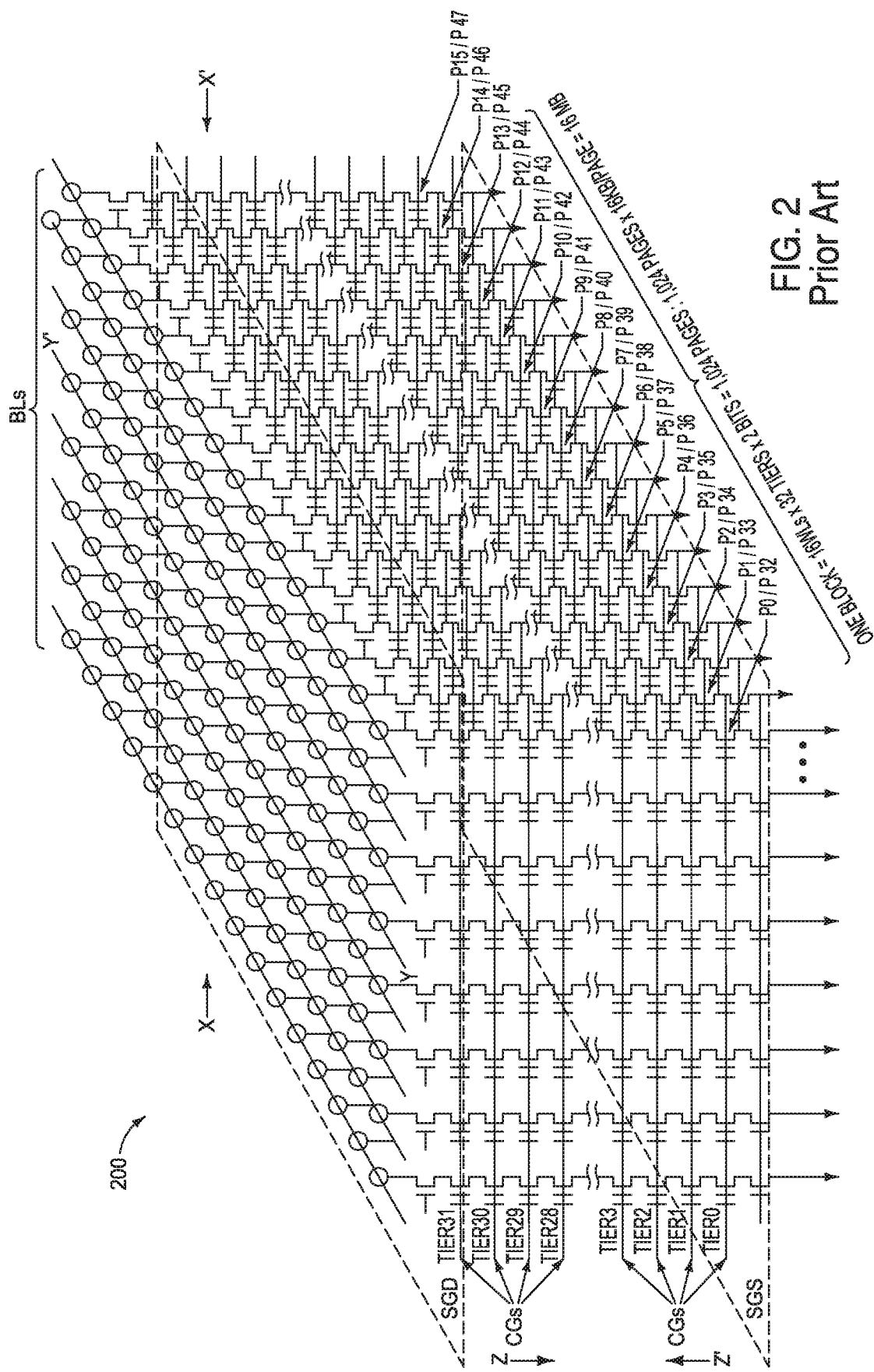
FIG. 2 shows a schematic diagram of the prior art memory device of FIG. 1 in the form of a 3D NAND memory device.
Figure 3:
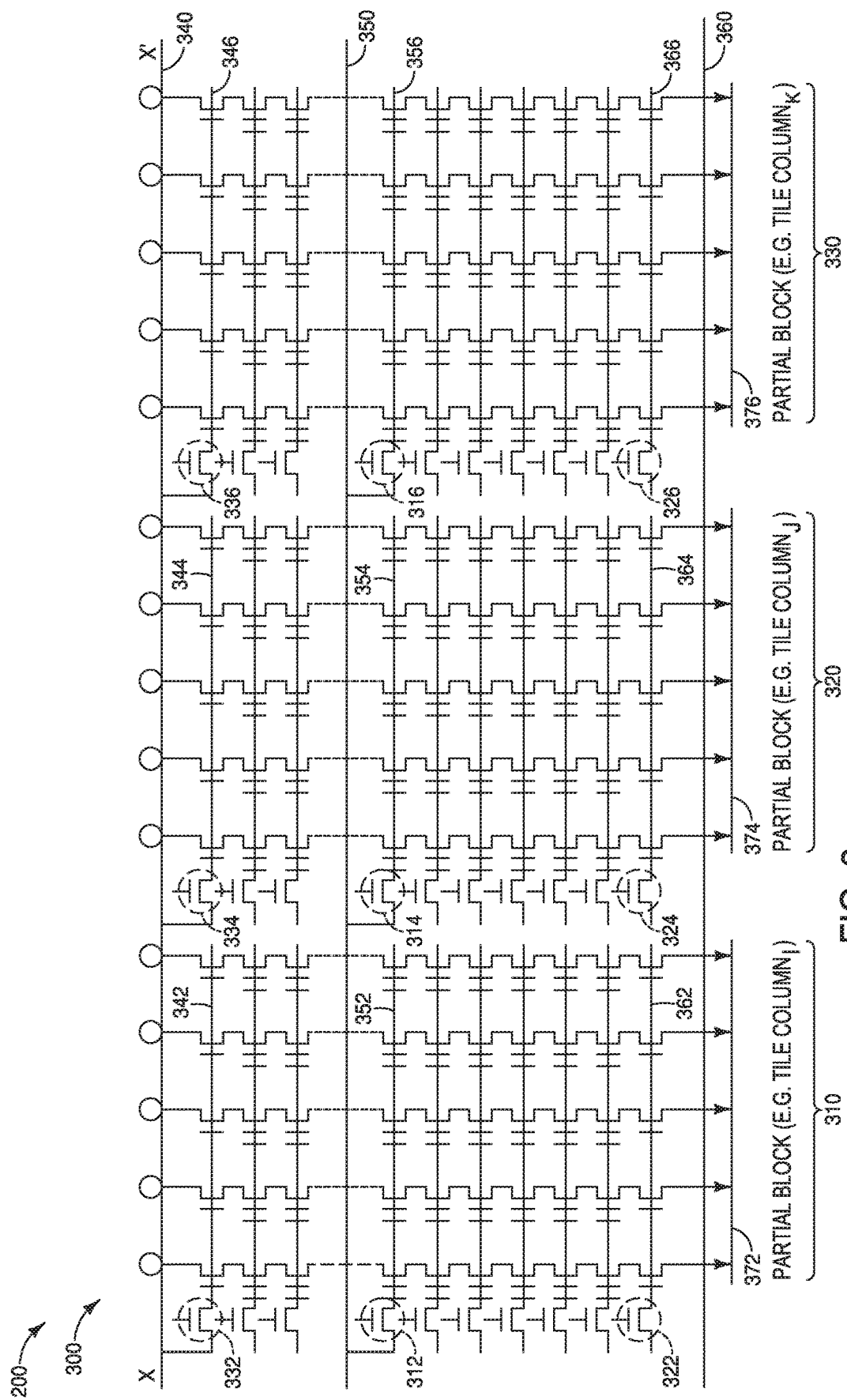
FIG. 3 shows a cross-sectional view of the prior art 3D NAND memory device of FIG. 2 in an X-X' direction.
Figure 4:
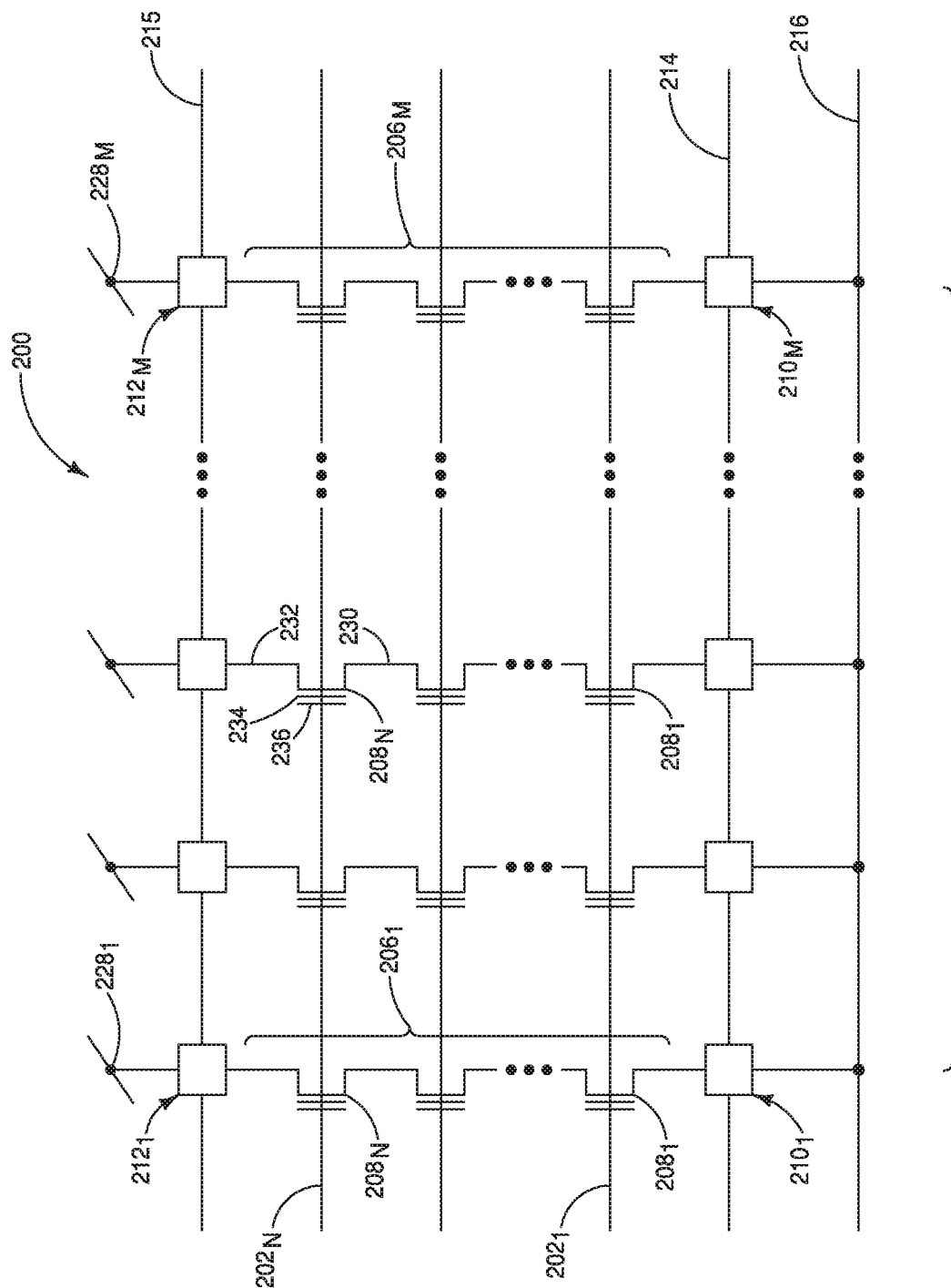
FIG. 4 is a schematic diagram of a prior art NAND memory array.
Figure 5:
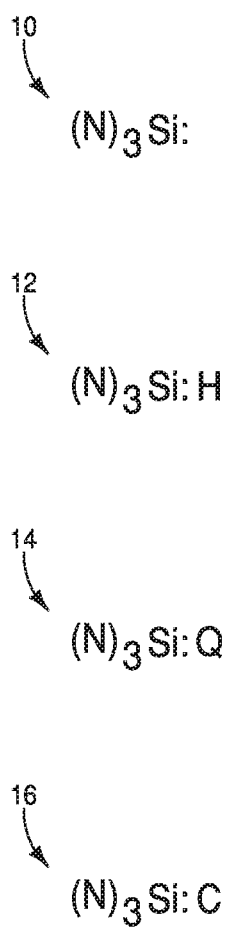
FIG. 5 illustrates chemical entities that may be present in charge-trapping-material.

Silicon nitride may be utilized as a charge-trapping-material of a memory cell. The charge-trapping-centers within the silicon nitride may correspond to dangling bonds. FIG. 5 shows an example charge-trapping-center 10 corresponding to a dangling bond associated with silicon. The charge-trapping-center 10 may be referred to as a k-center. The k-center has a trap depth associated therewith. Deeper traps are generally better for stable retention of charge than are shallower traps.

The trap depth of the k-center may be modified by entities interacting with the dangling bond of the charge-trapping-center 10. For instance, FIG. 5 also shows a configuration 12 in which hydrogen interacts with the k-center. The hydrogen modifies the trapping properties of the k-center, and effectively causes the k-center to behave as if it has a shallower trap depth.

Some embodiments include incorporation of trap-enhancing-additive within silicon nitride to achieve desired trapping properties from the silicon nitride. FIG. 5 shows a configuration 14 in which a species "Q" interacts with the k-center. The species "Q" may be a trap-enhancing-additive. In some embodiments, the species "Q" may be carbon (C), boron (B), phosphorus (P), metal (e.g., titanium (Ti) or tungsten (W)), etc. For instance, FIG. 5 also shows a configuration 16 in which carbon interacts with the k-center.

A continuing goal is to increase trap density within silicon nitride while maintaining desired retention properties. Conventional methods for increasing trap density may be to enrich the silicon nitride with silicon (i.e., to utilize silicon nitride having the chemical formula $Si_xN_4$, where x is greater than 3). However, the resulting silicon nitride tends to have a substantial amount of hydrogen therein, and accordingly the resulting charge-trapping-centers tend to be shallow traps rather than the desired deep traps.

Some embodiments include recognition that incorporation of trap-enhancing-additive within the silicon nitride may enable species within the additive (e.g., one or more of carbon, boron, phosphorus, metal, etc.) to interact with the k-centers so that desired trap depth is achieved within a charge-trapping-material while also maintaining desired trap density.

In some embodiments, a charge-trapping-material may include silicon, nitrogen and trap-enhancing-additive. The trap-enhancing-additive may include one or more of carbon, phosphorus, boron and metal (e.g., titanium, tungsten, etc.). The charge-trapping-material may include the nitrogen to a concentration within a range of from about 30 atomic percent (at %) to about 60 at %, may include the silicon to concentration within a range of from about 40 at % to about 45 at %, and may include the trap-enhancing-additive to concentration within a range of from about 0.2 at % to about 20 at %. It is desired that the trap-enhancing-additive be provided to a suitable concentration to satisfactorily influence trap depth of the charge-trapping-material. However, if the concentration is too great, the trap-enhancing-additive may undesirably cause the charge-trapping-material to become electrically conductive.

Figure 6:
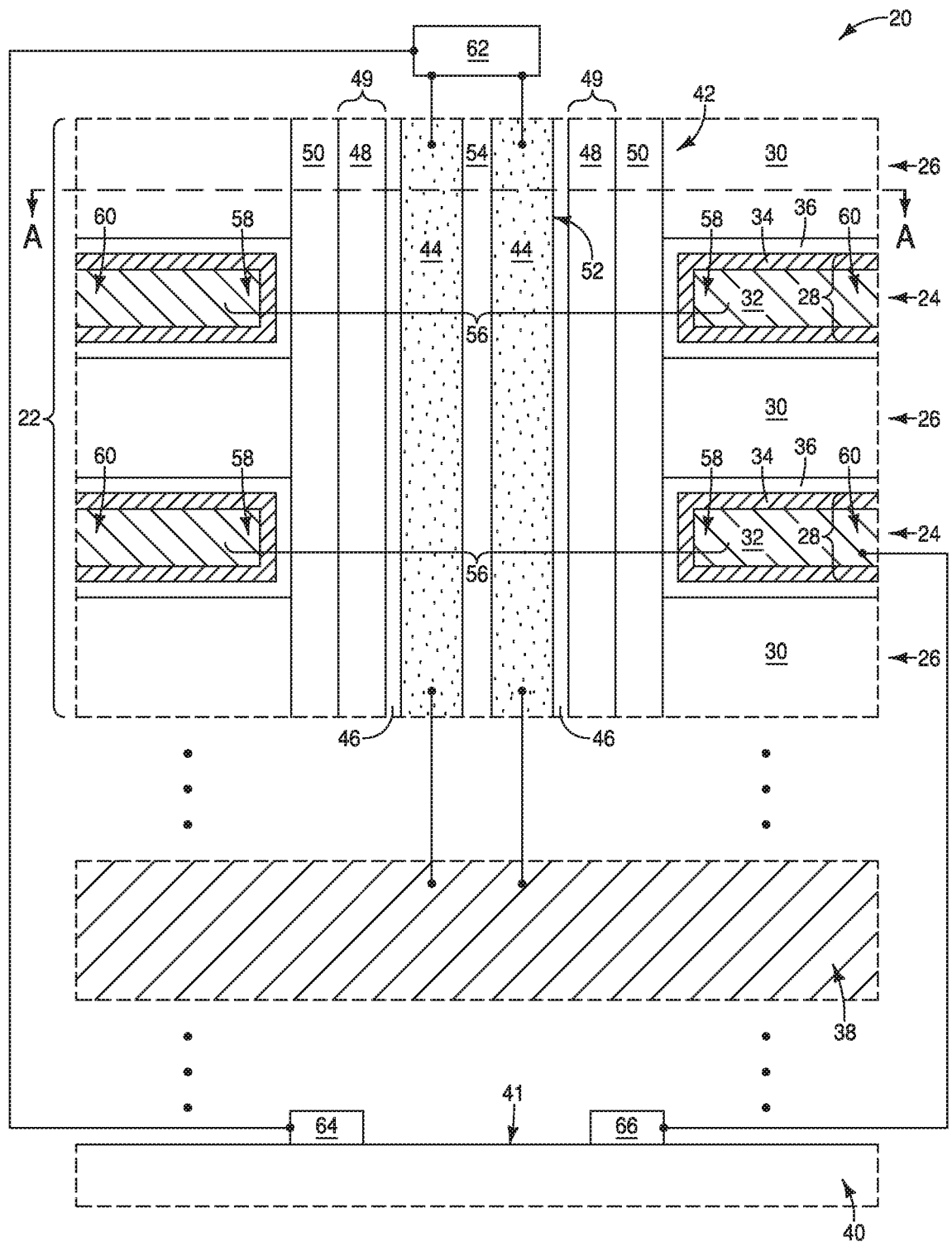
FIG. 6 is a diagrammatic cross-sectional side view of a region of an example integrated assembly (memory device).
Figure 6A:
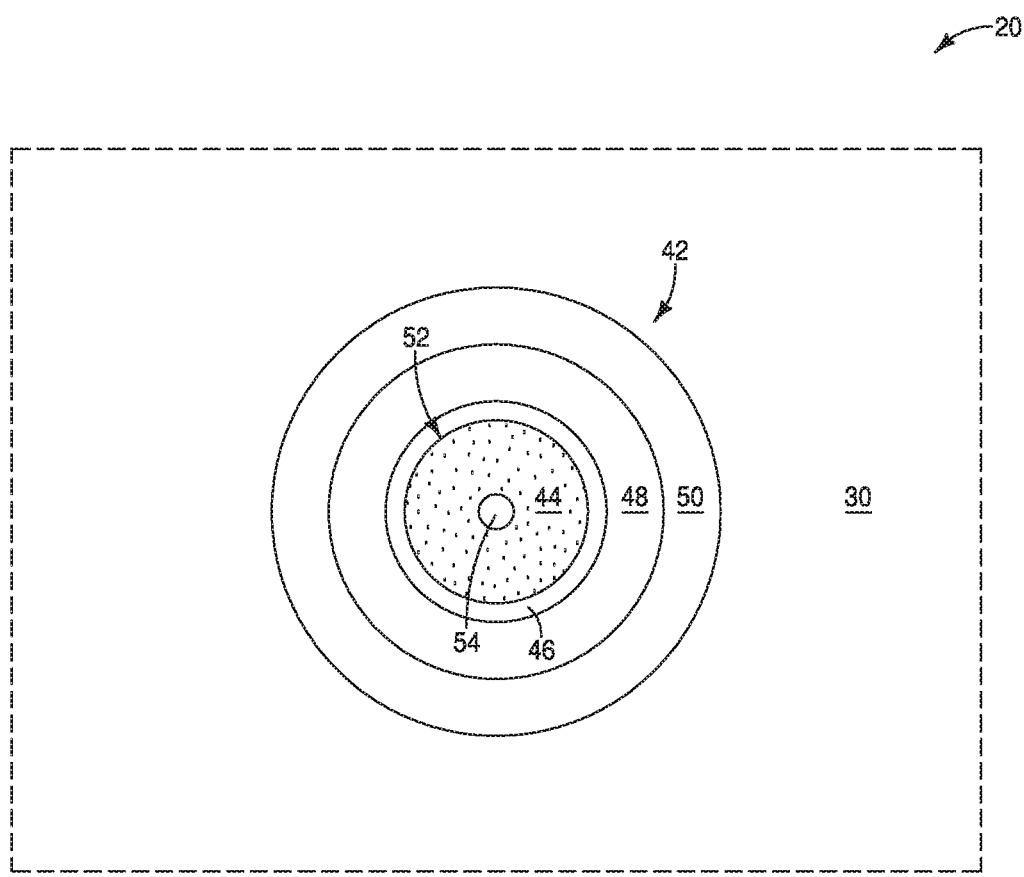
FIG. 6A is a diagrammatic cross-sectional top-down view along the line A-A of FIG. 6.

The charge-trapping-material may be incorporated into an integrated assembly. FIGS. 6 and 6A show an example region of an example integrated assembly 20. The integrated assembly 20 includes a stack 22 of alternating first and second levels 24 and 26. The first levels 24 comprise conductive structures 28 and may be referred to as conductive levels. The second levels 26 comprise insulative material 30 and may be referred to as insulative levels.

The conductive structures may comprise any suitable conductive composition(s). In the illustrated embodiment, each of the conductive structures 28 comprises a core material 32, and a conductive-liner-material 34 extending along an outer periphery of the core material. In some embodiments, the core material 32 may comprise, consist essentially of, or consist of tungsten; and the liner-material 34 may comprise, consist essentially of, or consist of one or both of titanium nitride and tungsten nitride.

The insulative material 30 may comprise any suitable composition(s); and in some embodiments may comprise, consist essentially of, or consist of silicon dioxide.

Dielectric-barrier-material 36 extends along an outer periphery of the liner-material 34. The dielectric-barrier-material 36 may comprise any suitable composition(s); and in some embodiments may comprise, consist essentially of, or consist of one or more high-k materials. The term "high-k" means a dielectric constant greater than that of silicon dioxide (i.e., greater than 3.9). Example high-k materials are aluminum oxide, hafnium oxide, zirconium oxide, etc.

The stack 22 is supported over a source structure 38. The source structure 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the source structure 38 may comprise conductively-doped silicon over tungsten silicide. The source structure 38 may be analogous to the structures 216 described above in the Background section of this disclosure.

The source structure 38 is supported by a base 40. The base 40 may comprise semiconductor material; and may, for example, comprise, consist essentially of, or consist of monocrystalline silicon. The base 40 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 40 may correspond to a semiconductor substrate containing one or more materials associated with integrated circuit fabrication. Such materials may include, for example, one or more of refractory metal materials, barrier materials, diffusion materials, insulator materials, etc.

The base 40 has a planar surface 41 which extends horizontally.

A pillar 42 extends through the stack 22, and in the shown embodiment the pillar extends vertically (i.e., orthogonally relative to the horizontal surface 41). The pillar 42 includes channel material 44, tunneling material 46, charge-trapping-material 48 and charge-blocking-material 50.

The channel material 44 comprises appropriately-doped semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 comprises, consists essentially of, or consists of appropriately-doped silicon.

The tunneling material 46 (also referred to as insulative material or as charge-passage material) may comprise any suitable composition(s); and in some embodiments may comprise one or more of silicon dioxide, silicon nitride, silicon oxynitride, etc. The tunneling material may comprise a single composition, or may comprise a laminate of compositions, with such laminate being bandgap-engineered to achieve desired tunneling properties.

The charge-trapping-material 48 may comprise silicon, nitrogen and the trap-enhancing-additive described above (e.g., one or more of carbon, phosphorus, boron and metal).

The charge-blocking-material 50 may comprise any suitable composition(s); and in some embodiments may comprise silicon, oxygen and nitrogen (i.e., may comprise silicon oxynitride).

The channel material 44 within the pillar 42 is configured as a vertically-extending cylinder 52. In some embodiments, such cylinder 52 may be referred to as a channel-material-cylinder, or as a channel-material-pillar. In the illustrated embodiment, the channel-material-cylinder 52 is hollow, and a dielectric material 54 is provided within the hollow in the cylinder 52. The dielectric material 54 may comprise any suitable composition(s); and in some embodiments may comprise, consist essentially of, or consist of silicon dioxide.

The top-down view of FIG. 6A shows the channel material 44 configured as an annular ring surrounding the dielectric material 54.

Vertically-stacked memory cells 56 are along the pillar 42. Each of the memory cells includes regions of the channel material 44, tunneling material 46, charge-trapping-material 48, charge-blocking-material 50, dielectric-barrier-material 36, and conductive structures 28. The charge-trapping-material 48 may be considered to be within a charge-trapping-region 49. Although the charge-trapping-region 49 is shown to extend continuously through the stack 22, it is to be understood that in other embodiments the charge-trapping-region may be discontinuous so that charge-trapping-regions are only along the levels 24 (i.e., the memory cell levels), and are not along the levels 26. Such discontinuity of the charge-trapping-material 48 may alleviate cross-talk between vertically-neighboring memory cells 56 to the extent that such cross-talk is found to be problematic.

The portions of the conductive structures 28 within the memory cells 56 may be considered to be gating regions 58. Other portions of the conductive structures 28 which are not within the memory cells 56 may be considered to be routing regions (wordline regions) 60.

The channel material 44 is shown to be electrically coupled with the source structure 38. A gap is illustrated between the source structure 38 and the stacked memory cells 56 to indicate that there may be other materials and devices between the source structure 38 and the memory cells. For instance, source-side select gates (SGSs) may be provided between the source structure 38 and the vertically-stacked memory cells 56.

The stacked memory cells 56 along the pillar 42 may correspond to a string of NAND memory devices. There may be any suitable number of memory cells within the string. For instance, in some embodiments the string may comprise eight memory cells, 16 memory cells, 32 memory cells, 64 memory cells, 128 memory cells, etc.

The channel-material-pillar 52 may be electrically coupled to a bitline 62, which in turn may be electrically coupled with sensing circuitry (e.g., sense-amplifier-circuitry) 64.

The routing regions (wordline regions) 60 may be electrically coupled with wordline-driver-circuitry 66 (only one of such connections is shown to simplify the drawing of FIG. 6).

In the illustrated embodiment, the sense-amplifier-circuitry 64 and the wordline-driver-circuitry 66 are along the base 40 and beneath the memory cells 56 (i.e., beneath a memory array comprising the memory cells 56). The sense-amplifier-circuitry 64 and wordline-driver-circuitry 66 may be considered to be examples of logic circuitry (e.g., CMOS circuitry) which may be provided beneath an array of the memory cells 56. In some embodiments, at least some of the logic circuitry may be directly beneath the array of memory cells 56, and other portions of the logic circuitry may or may not be directly beneath the array of the memory cells (i.e., may be over the array of the memory cells, laterally offset relative to the array of the memory cells, etc.).

The base 40 is illustrated to be spaced from the source structure 38 by a gap to indicate that there may be additional components and materials between the base 40 and the structure 38. Such additional components and materials may include, for example, regions of the illustrated logic circuits 64 and 66.

Figure 7:
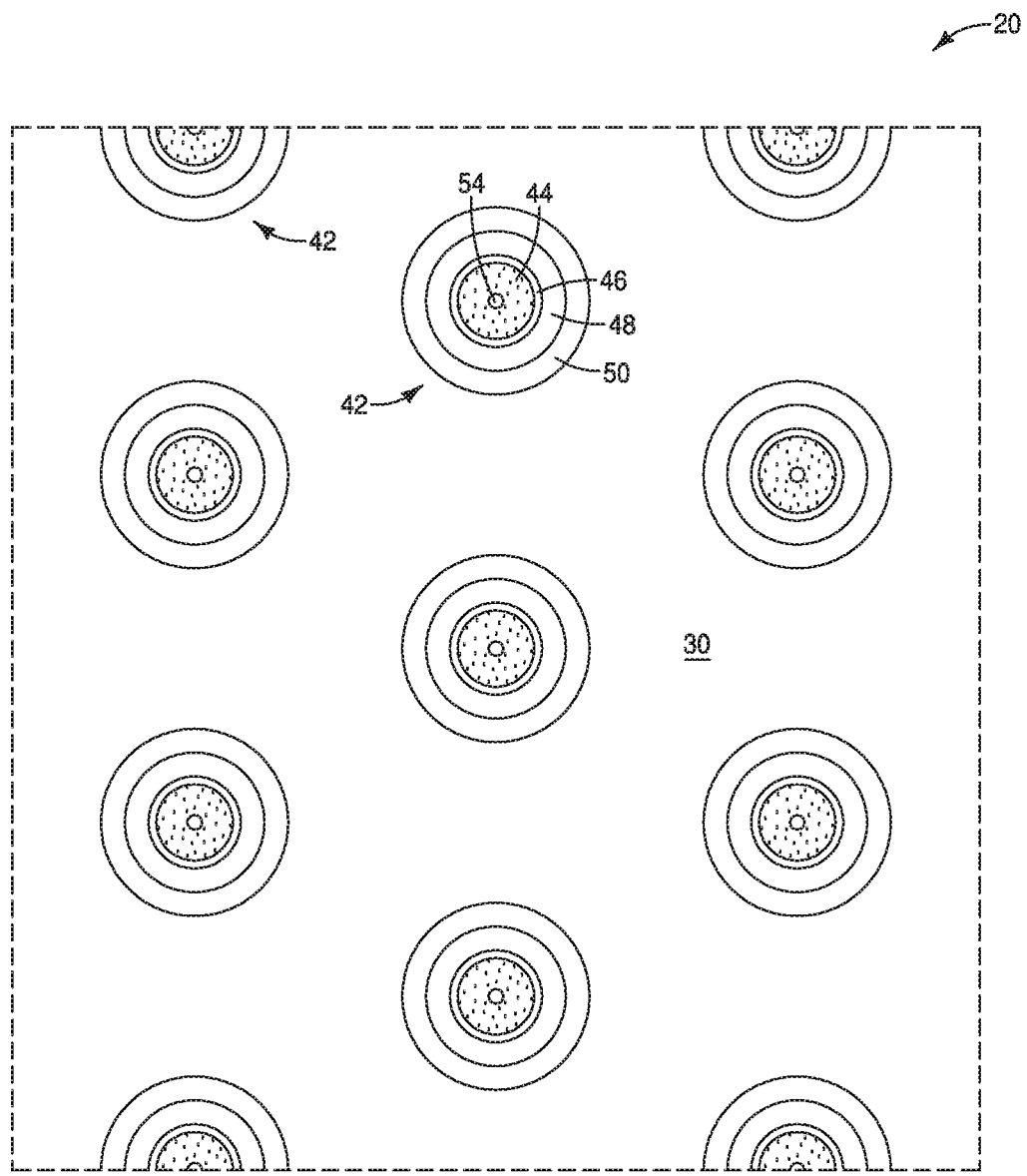
FIG. 7 is a diagrammatic cross-sectional top-down view of a region of an example integrated assembly (memory device).

The pillar 42 may be representative of a large number of substantially identical pillars associated with a memory array; with the term "substantially identical" meaning identical to within reasonable tolerances of fabrication and measurement. FIG. 7 illustrates a larger region of the assembly 20 than is shown in FIG. 6A, and shows a plurality of the pillars packed in a substantially hexagonal arrangement (where the term "substantially hexagonal arrangement" means a hexagonal arrangement to within reasonable tolerances of fabrication and measurement).

Figure 8:
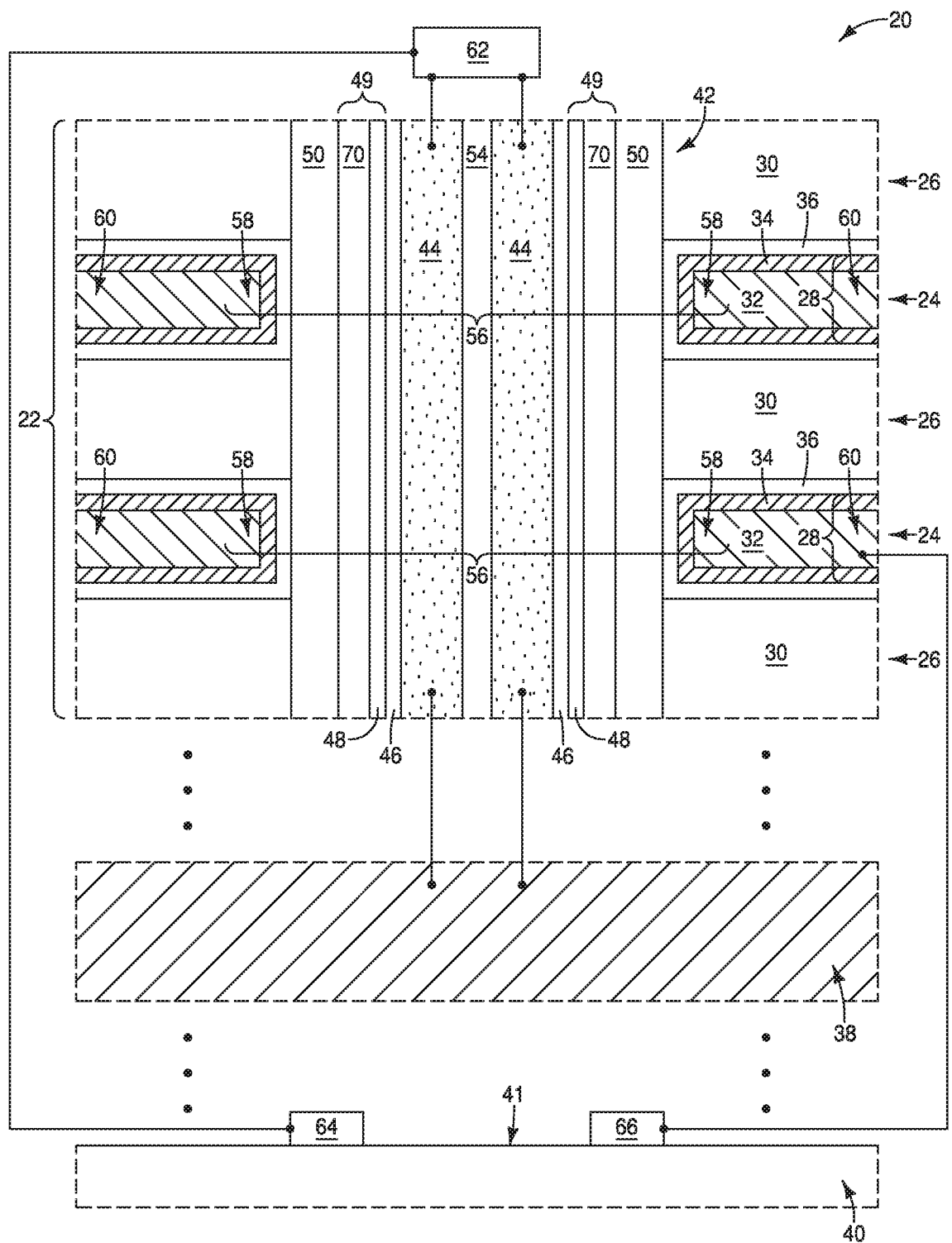
FIGS. 8-10 are diagrammatic cross-sectional side views of regions of example integrated assemblies (memory devices).
Figure 9:
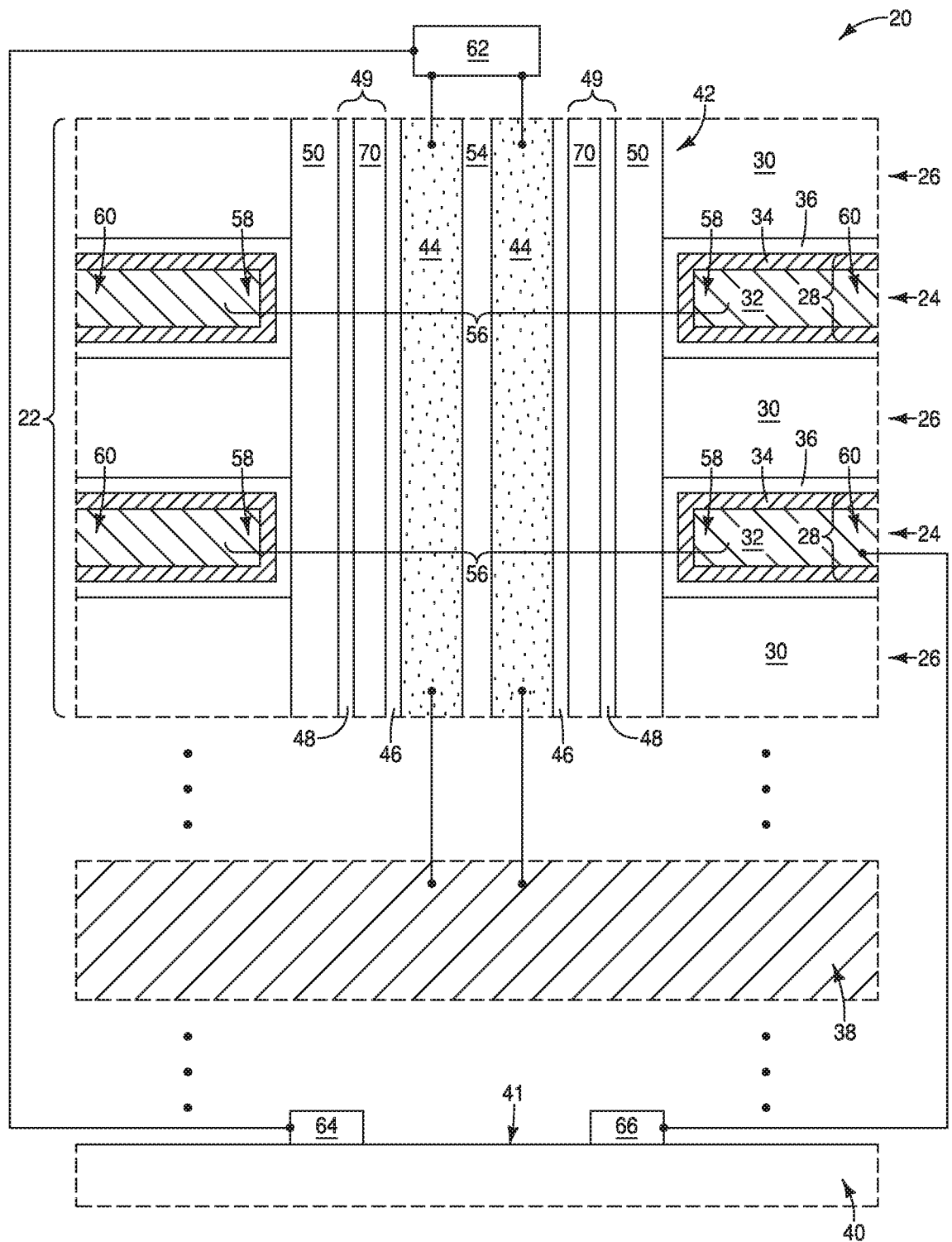
Figure 10:
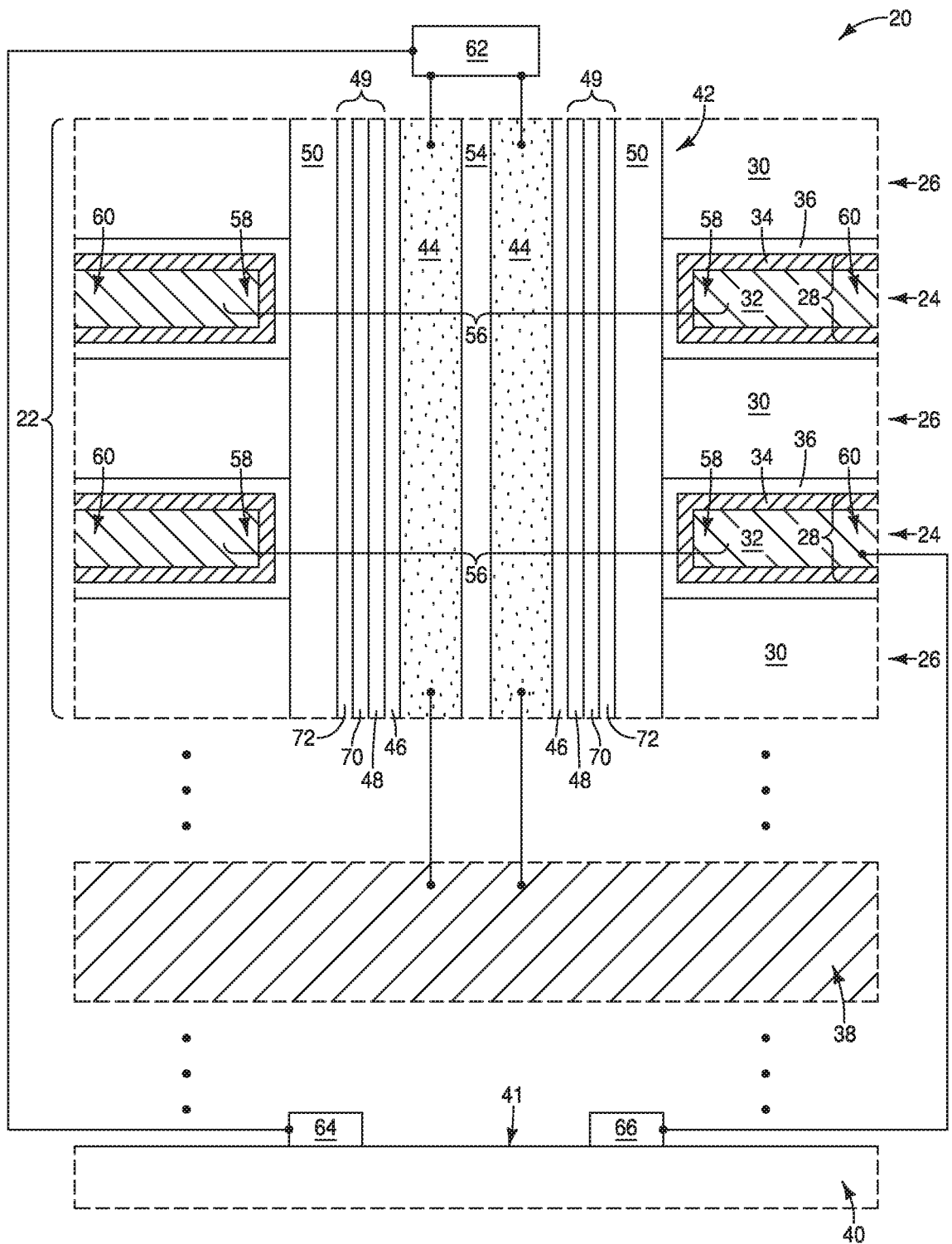

The charge-trapping-regions 49 of FIG. 6 may comprise two or more different compositions of charge-trapping-materials. FIGS. 8-10 illustrate example embodiments in which the charge-trapping-regions comprise multiple charge-trapping-materials.

Referring to FIG. 8, the charge-trapping-regions comprise the charge-trapping-material 48 as a first charge-trapping-material, and comprise a second charge-trapping-material 70 directly against the first charge-trapping-material 48. The second charge-trapping-material 70 may comprise less trap-enhancing-additive than the first charge-trapping-material 48, and in some embodiments will comprise none of the trap-enhancing-additive. Accordingly, the second charge-trapping-material 70 may comprise a conventional composition. In the embodiment of FIG. 8, the charge-trapping-material 48 is adjacent to the tunneling material 46 and may improve trapping efficiency of the trapping region 49 as compared to a trapping region comprising only a conventional charge-trapping-material. In some embodiments, the materials 48 and 70 may have thicknesses within a range of from about 10 Å to about 100 Å. The charge-trapping-materials 48 and 70 may have a same thickness as one another, or may comprise different thicknesses relative to one another. In some embodiments, the material 70 may comprise a conventional charge-trapping material (i.e., may comprise silicon and nitrogen, and may lack the trap-enhancing additive), and may be formed to be thicker than the charge-trapping-material 48.

FIG. 9 shows an embodiment similar to that of FIG. 8, but shows the first charge-trapping material 48 directly against the charge-blocking-material 50, while the second charge-trapping-material 70 is directly against the tunneling material 46. The embodiment of FIG. 9 may be useful for confining trapped charge near an interface of the charge-trapping region 49 and the charge-blocking-material 50.

FIG. 10 shows an embodiment in which the charge-trapping-regions 49 utilize three charge-trapping-materials 48, 70 and 72. Such materials may be referred to as first, second and third charge-trapping-materials, respectively. In some embodiments, the second charge-trapping-material 70 may comprise less trap-enhancing-additive than the first and third charge-trapping-materials 48 and 72. In some embodiments, the charge-trapping-material 70 may comprise silicon and nitrogen, and may lack trap-enhancing-additive.

The third charge-trapping-material 72 may comprise a same composition as the first charge-trapping-material 48, or may comprise a different composition relative to the first charge-trapping-material. Regardless, the third charge-trapping-material 72 may comprise silicon, nitrogen and trap-enhancing additive. The trap-enhancing-additive within the material 72 may be referred to as a second trap-enhancing-additive to distinguish it from the first trap-enhancing-additive within the material 48. The second trap-enhancing-additive may comprise one or more of carbon, boron, phosphorus and metal (e.g., titanium, tungsten, etc.) provided to a concentration within a range of from about 0.2 at % to about 20 at %.

In some example embodiments, the materials 48 and 72 may comprise nitrogen, silicon and carbon; with the nitrogen being present to a concentration within a range of from about 30 atomic percent (at %) to about 60 at %, the silicon being present to concentration within a range of from about 40 at % to about 45 at %, and the carbon being present to concentration within a range of from about 0.2 at % to about 20 at %.

The memory cells 56 described herein may be operated as part of NAND memory devices. In operation, the charge-trapping-material (regions 49) may be configured to store information in the memory cells 56. The value (with the term "value" representing one bit or multiple bits) of information stored in an individual memory cell 56 may be based on the amount of charge (e.g., the number of electrons) stored in a charge-trapping-region of the memory cell. The amount of charge within an individual charge-trapping-region may be controlled (e.g., increased or decreased) at least in part, based on the value of voltage applied to an associated control gate, and/or based on the value of voltage applied to an associated channel material 44.

The tunneling material 46 may be configured to allow desired tunneling (e.g., transportation) of charge (e.g., electrons) between the charge-trapping-regions 49 and the channel material 44. The tunneling material may be configured (i.e., engineered) to achieve a selected criterion, such as, for example, but not limited to, an equivalent oxide thickness (EOT). The EOT quantifies the electrical properties of the tunneling material, (e.g., capacitance) in terms of a representative physical thickness. For example, EOT may be defined as the thickness of a theoretical silicon dioxide layer that would be required to have the same capacitance density as a given dielectric (e.g., tunneling material 46), ignoring leakage current and reliability considerations.

The charge-blocking-material (50) may provide a mechanism to block charge from flowing from the charge-trapping-regions (49) to the control gates (58).

The dielectric barrier material 36 may be utilized to inhibit back-tunneling of electrons from the control gates (58) toward the charge-trapping-regions (49).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell having charge-trapping-material between a semiconductor channel material and a gating region. The charge-trapping-material includes silicon, nitrogen and trap-enhancing-additive. The trap-enhancing-additive includes one or more of carbon, phosphorus, boron and metal.

Some embodiments include an integrated assembly having a stack of alternating first and second levels. The first levels include conductive structures and the second levels are insulative. Channel-material-pillars extend through the stack. Charge-trapping-regions are along the channel-material-pillars and are between the channel-material-pillars and the conductive structures. The charge-trapping-regions include a charge-trapping-material which contains silicon, nitrogen and trap-enhancing-additive. The trap-enhancing-additive includes one or more of carbon, phosphorus, boron and metal.

Some embodiments include an integrated assembly which comprises a stack of alternating first and second levels. The first levels include conductive structures and the second levels are insulative. Channel material extends through the stack. Tunneling material is adjacent to the channel material. Charge-trapping-regions are adjacent to the tunneling material and along the first levels. The charge-trapping-regions include a charge-trapping-material which comprises silicon, nitrogen and carbon. The nitrogen within the charge-trapping-material is to a concentration within a range of from about 30 at % to about 60 at %, the silicon within the charge-trapping-material is to a concentration within a range of from about 40 at % to about 45 at %, and the carbon within the charge-trapping-material is to a concentration within a range of from about 0.2 at % to about 20 at %. Charge-blocking-material is adjacent to the charge-trapping-regions. Dielectric-barrier-material is adjacent to the charge-blocking-material, and is between the charge-blocking-material and the conductive structures. is adjacent to the charge-trapping-regions. Dielectric-barrier-material is adjacent to the charge-blocking-material, and is between the charge-blocking-material and the conductive structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising:
   a first charge-trapping-material between a semiconductor channel material and a gating region; the first charge-trapping-material including silicon, nitrogen and trap-enhancing-additive; the trap-enhancing-additive including one or more of carbon, phosphorus, boron and metal;
   a second charge-trapping-material adjacent the first charge-trapping-material;
   a third charge-trapping-material adjacent one of the first and second charge-trapping-materials; the third charge-trapping-material comprising a trap-enhancing-additive; and
   wherein a charge-trapping-region is between the semiconductor channel material and the gating region; and wherein the first charge-trapping-material within the charge-trapping-region is directly against the second charge-trapping-material within the charge-trapping-region; and wherein the second charge-trapping-material comprises silicon and nitrogen, and does not include the trap-enhancing-additive.

2. The memory cell of claim 1 wherein the nitrogen within the first charge-trapping-material is to a concentration within a range of from about 30 at % to about 60 at %, and wherein the silicon within the first charge-trapping-material is to a concentration within a range of from about 40 at % to about 45 at %.

3. The memory cell of claim 2 wherein the trap-enhancing-additive within the first charge-trapping-material is to a concentration within a range of from about 0.2 at % to about 20 at %.

4. The memory cell of claim 3 wherein the trap-enhancing-additive comprises the carbon.

5. The memory cell of claim 3 wherein the trap-enhancing-additive comprises the boron.

6. The memory cell of claim 3 wherein the trap-enhancing-additive comprises the phosphorus.

7. The memory cell of claim 1 wherein the trap-enhancing-additive comprises the metal, and wherein the metal includes both of titanium and tungsten.

8. The memory cell of claim 1 wherein the third charge-trapping-material is directly against the second charge-trapping-material and on an opposing side of the second charge-trapping-material relative to the first charge-trapping-material; wherein the trap-enhancing-additive is a first trap-enhancing-additive; wherein the third charge-trapping-material comprises silicon, nitrogen and a second trap-enhancing-additive; and wherein the second trap-enhancing-additive includes one or more of carbon, phosphorus, boron and metal.

9. The memory cell of claim 8 wherein the third charge-trapping-material is a same composition as the first charge-trapping-material.

10. An integrated assembly, comprising:
    a stack of alternating first and second levels; the first levels including conductive structures and the second levels being insulative;
    channel-material-pillars extending through the stack;
    charge-trapping-regions extending through the stack along the channel-material-pillars and being between the channel-material-pillars and the conductive structures; each of the charge-trapping-regions including at least two discrete layers comprising a charge-trapping-material which comprises silicon, nitrogen and trap-enhancing-additive; the trap-enhancing-additive including one or more of carbon, phosphorus, boron and metal; and
    wherein one of the at least two discrete layers of the charge-trapping-material comprises less of the trap-enhancing-additive than the other of the at least two discrete layers of the charge-trapping-material.

11. The integrated assembly of claim 10 wherein the channel-material-pillars comprise silicon.

12. The integrated assembly of claim 10 further comprising:
    tunneling regions between the channel-material-pillars and the charge-trapping-regions;
    charge-blocking-regions between the charge-trapping-regions and the conductive structures; and
    wherein one of the at least two discrete layers of the charge-trapping-material is between the other of the at least two discrete layers of the charge-trapping-material and the tunneling regions.

13. The integrated assembly of claim 10 further comprising:
    tunneling regions between the channel-material-pillars and the charge-trapping-regions;
    charge-blocking-regions between the charge-trapping-regions and the conductive structures; and
    wherein the charge-trapping-regions include a third discrete layer of charge-trapping-material in addition to the at least two discrete layers of the charge-trapping-materials; wherein one discrete layer of the charge-trapping-material is between two of the discrete layers of the charge-trapping-materials; wherein the two of the discrete layers of the charge-trapping-materials comprise higher concentrations of the trap-enhancing-additive than the one discrete layer of the charge-trapping-material.

14. The integrated assembly of claim 10 wherein the trap-enhancing-additive within the charge-trapping-material is to a concentration within a range of from about 0.2 at % to about 20 at %.

15. The integrated assembly of claim 14 wherein the trap-enhancing-additive comprises the carbon.

16. The integrated assembly of claim 14 wherein the trap-enhancing-additive comprises the boron.

17. The integrated assembly of claim 10 wherein the trap-enhancing-additive comprises the metal, and wherein the metal includes both of titanium and tungsten.

18. The integrated assembly of claim 10 comprising memory cells along the first levels; each of the memory cells including a region of one of the channel-material-pillars and a region of one of the conductive structures; the regions of the conductive structures within the memory cells being gating regions; other regions of the conductive structures not being within the memory cells and being routing regions.

19. The integrated assembly of claim 18 including logic circuitry under the memory cells.

20. The integrated assembly of claim 19 wherein the logic circuitry includes wordline-driver-circuitry and/or sense-amplifier-circuitry.

21. An integrated assembly, comprising:
a stack of alternating first and second levels; the first levels including conductive structures and the second levels being insulative;
channel material extending through the stack;
tunneling material adjacent the channel material;
charge-trapping-regions adjacent the tunneling material and along the first levels; the charge-trapping-regions including a charge-trapping-material which comprises silicon, nitrogen and carbon; the nitrogen within the charge-trapping-material being to a concentration within a range of from about 30 at % to about 60 at %, the silicon within the charge-trapping-material being to a concentration within a range of from about 40 at % to about 45 at %, and the carbon within the charge-trapping-material being to a concentration within a range of from about 0.2 at % to about 20 at %;
wherein the charge-trapping-material comprises a first charge-trapping-material;
a second charge-trapping-material adjacent the first charge-trapping-material;
and a third charge-trapping-material adjacent the second charge-trapping-material;
charge-blocking-material adjacent the charge-trapping-regions;
dielectric-barrier-material adjacent the charge-blocking-material, and being between the charge-blocking-material and the conductive structures; and
wherein the second charge-trapping-material has a different composition than the first charge-trapping-material.

22. The integrated assembly of claim 21 wherein the second charge-trapping-material is directly against the first charge-trapping-material.

23. The integrated assembly of claim 22 wherein the second charge-trapping-material is between the first charge-trapping-material and the tunneling material.

24. The integrated assembly of claim 22 wherein the second charge-trapping-material is between the first charge-trapping-material and the charge-blocking-material.

25. The integrated assembly of claim 21 wherein the second charge-trapping-material comprises less carbon than the first charge-trapping-material.

26. The integrated assembly of claim 21 wherein the second charge-trapping-material comprises silicon and nitrogen, and lacks carbon.

27. The integrated assembly of claim 21 wherein:
the third charge-trapping-material has a same composition as the first charge-trapping-material; and
the second charge-trapping-material is between the first and third charge-trapping-materials.

28. The integrated assembly of claim 27 wherein the second charge-trapping-material comprises less carbon than the first and third charge-trapping-materials.

29. The integrated assembly of claim 27 wherein the second charge-trapping-material comprises silicon and nitrogen, and lacks carbon.

30. The integrated assembly of claim 10 wherein the trap-enhancing-additive comprises two or more of carbon, phosphorus, boron and metal.

31. The integrated assembly of claim 21 wherein charge-trapping-material further comprises phosphorus.

32. A memory cell comprising charge-trapping-material between a semiconductor channel material and a gating region; the charge-trapping-material including silicon, nitrogen and trap-enhancing-additive; the trap-enhancing-additive including one or more of carbon, phosphorus, boron and metal;
wherein a charge-trapping-region is between the semiconductor channel material and the gating region; and wherein the charge-trapping-material is a first charge-trapping-material within the charge-trapping-region and is directly against a second charge-trapping-material within the charge-trapping-region; and wherein the second charge-trapping-material comprises silicon and nitrogen, and does not include the trap-enhancing-additive; and
wherein the charge-trapping-region includes a third charge-trapping-material directly against the second charge-trapping-material and on an opposing side of the second charge-trapping-material relative to the first charge-trapping-material; wherein the trap-enhancing-additive is a first trap-enhancing-additive; wherein the third charge-trapping-material comprises silicon, nitrogen and a second trap-enhancing-additive; and wherein the second trap-enhancing-additive includes one or more of carbon, phosphorus, boron and metal.

33. The memory cell of claim 32 wherein the third charge-trapping-material is a same composition as the first charge-trapping-material.

34. An integrated assembly, comprising:
a stack of alternating first and second levels; the first levels including conductive structures and the second levels being insulative;
channel-material-pillars extending through the stack;
charge-trapping-regions along the channel-material-pillars and being between the channel-material-pillars and the conductive structures; the charge-trapping-regions including a charge-trapping-material which comprises silicon, nitrogen and trap-enhancing-additive; the trap-enhancing-additive including one or more of carbon, phosphorus, boron and metal;
wherein:
the charge-trapping-material is a first charge-trapping-material within the charge-trapping-regions and is directly against a second charge-trapping-material within the charge-trapping-regions; and
the second charge-trapping-material comprises silicon and nitrogen, and comprises a different composition relative to the first charge-trapping-material; and
tunneling regions between the channel-material-pillars and the charge-trapping-regions;
charge-blocking-regions between the charge-trapping-regions and the conductive structures; and
wherein the charge-trapping-regions include a third charge-trapping-material in addition to the first and second charge-trapping-materials; wherein the second charge-trapping-material is between the first and third charge-trapping-materials; wherein the first and third charge-trapping-materials comprise higher concentrations of the trap-enhancing-additive than the second charge-trapping-material.

35. An integrated assembly, comprising:
a stack of alternating first and second levels; the first levels including conductive structures and the second levels being insulative;
channel-material-pillars extending through the stack;
charge-trapping-regions along the channel-material-pillars and being between the channel-material-pillars and the conductive structures; the charge-trapping-regions including a charge-trapping-material which comprises silicon, nitrogen and trap-enhancing-additive; the trapenhancing-additive including one or more of carbon, phosphorus, boron and metal; and memory cells along the first levels; each of the memory cells including a region of one of the channel-material-pillars and a region of one of the conductive structures; the regions of the conductive structures within the memory cells being gating regions; other regions of the conductive structures not being within the memory cells and being routing regions.

36. The integrated assembly of claim 35 including logic circuitry under the memory cells.

37. The integrated assembly of claim 36 wherein the logic circuitry includes wordline-driver-circuitry and/or sense-amplifier-circuitry.

38. An integrated assembly, comprising:
a stack of alternating first and second levels; the first levels including conductive structures and the second levels being insulative;
channel material extending through the stack;
tunneling material adjacent the channel material;
charge-trapping-regions adjacent the tunneling material and along the first levels; the charge-trapping-regions including a charge-trapping-material which comprises silicon, nitrogen and carbon; the nitrogen within the charge-trapping-material being to a concentration within a range of from about 30 at % to about 60 at %, the silicon within the charge-trapping-material being to a concentration within a range of from about 40 at % to about 45 at %, and the carbon within the charge-trapping-material being to a concentration within a range of from about 0.2 at % to about 20 at %;
charge-blocking-material adjacent the charge-trapping-regions;
dielectric-barrier-material adjacent the charge-blocking-material, and being between the charge-blocking-material and the conductive structures; and
wherein:
the charge-trapping-material is a first charge-trapping-material;
the charge-trapping-regions include a second charge-trapping-material and a third charge-trapping-material in addition to the first charge-trapping-material;
the second charge-trapping-material has a different composition than the first charge-trapping-material;
the third charge-trapping-material has a same composition as the first charge-trapping-material; and
the second charge-trapping-material is between the first and third charge-trapping-materials.

39. The integrated assembly of claim 38 wherein the second charge-trapping-material comprises less carbon than the first and third charge-trapping-materials.

40. The integrated assembly of claim 38 wherein the second charge-trapping-material comprises silicon and nitrogen, and lacks carbon.

41. The memory cell of claim 1 wherein:
the semiconductor channel material comprises a pillar; and
two of the first, second and third charge-trapping-materials comprise discrete layers that extend along a length of the pillar.

42. The memory cell of claim 1 wherein:
the semiconductor channel material comprises a pillar; and
each of the first, second and third charge-trapping-materials comprise discrete layers that extend along a length of the pillar.

43. The integrated assembly of claim 10 wherein each of the charge-trapping-regions comprises a third discrete layer comprising a charge-trapping-material, the charge-trapping-material comprising a trap-enhancing-additive.

44. The integrated assembly of claim 21 wherein the third charge-trapping-material has a same composition as the first charge-trapping-material.

45. The integrated assembly of claim 21 wherein the second charge-trapping-material comprises a trap-enhancing-additive.

46. The integrated assembly of claim 45 wherein the third charge-trapping-material comprises a trap-enhancing-additive.

47. An integrated assembly, comprising:
a stack of alternating first and second levels; the first levels including conductive structures and the second levels being insulative;
channel-material-pillars extending through the stack;
charge-trapping-regions extending through the stack along the channel-material-pillars and being between the channel-material-pillars and the conductive structures; each of the charge-trapping-regions including at least two discrete layers comprising a charge-trapping-material which comprises silicon, nitrogen and trap-enhancing-additive; the trap-enhancing-additive including one or more of carbon, phosphorus, boron and metal;
tunneling regions between the channel-material-pillars and the charge-trapping-regions;
charge-blocking-regions between the charge-trapping-regions and the conductive structures; and
wherein the charge-trapping-regions include a third discrete layer of charge-trapping-material in addition to the at least two discrete layers of the charge-trapping-materials; wherein one discrete layer of the charge-trapping-material is between two of the discrete layers of the charge-trapping-materials; wherein the two of the discrete layers of the charge-trapping-materials comprise higher concentrations of the trap-enhancing-additive than the one discrete layer of the charge-trapping-material.

48. An integrated assembly, comprising:
a stack of alternating first and second levels; the first levels including conductive structures and the second levels being insulative;
channel-material-pillars extending through the stack;
charge-trapping-regions extending through the stack along the channel-material-pillars and being between the channel-material-pillars and the conductive structures; each of the charge-trapping-regions including at least two discrete layers comprising a charge-trapping-material which comprises silicon, nitrogen and trap-enhancing-additive; the trap-enhancing-additive including one or more of carbon, phosphorus, boron and metal; and
memory cells along the first levels; each of the memory cells including a region of one of the channel-material-pillars and a region of one of the conductive structures; the regions of the conductive structures within the memory cells being gating regions; other regions of the conductive structures not being within the memory cells and being routing regions.

49. The integrated assembly of claim 48 including logic circuitry under the memory cells.

50. The integrated assembly of claim 49 wherein the logic circuitry includes wordline-driver-circuitry and/or sense-amplifier-circuitry.

51. An integrated assembly, comprising:

a stack of alternating first and second levels; the first levels including conductive structures and the second levels being insulative;

channel material extending through the stack;

tunneling material adjacent the channel material;

charge-trapping-regions adjacent the tunneling material and along the first levels; the charge-trapping-regions including a charge-trapping-material which comprises silicon, nitrogen and carbon; the nitrogen within the charge-trapping-material being to a concentration within a range of from about 30 at % to about 60 at %, the silicon within the charge-trapping-material being to a concentration within a range of from about 40 at % to about 45 at %, and the carbon within the charge-trapping-material being to a concentration within a range of from about 0.2 at % to about 20 at %;

wherein the charge-trapping-material comprises a first charge-trapping-material;

a second charge-trapping-material adjacent the first charge-trapping-material;

and a third charge-trapping-material adjacent the second charge-trapping-material;

charge-blocking-material adjacent the charge-trapping-regions;

dielectric-barrier-material adjacent the charge-blocking-material, and being between the charge-blocking-material and the conductive structures;

the second charge-trapping-material has a different composition than the first charge-trapping-material;

the third charge-trapping-material has a same composition as the first charge-trapping-material; and the second charge-trapping-material is between the first and third charge-trapping-materials.

52. The integrated assembly of claim 51 wherein the second charge-trapping-material comprises less carbon than the first and third charge-trapping-materials.

53. The integrated assembly of claim 51 wherein the second charge-trapping-material comprises silicon and nitrogen, and lacks carbon.

\* \* \* \* \*